US 11,476,229 B2

United States Patent
Miyazaki

(10) Patent No.: US 11,476,229 B2
(45) Date of Patent: Oct. 18, 2022

(54) SEMICONDUCTOR DEVICE MANUFACTURING METHOD

(71) Applicant: Kioxia Corporation, Minato-ku (JP)

(72) Inventor: Chikara Miyazaki, Mie (JP)

(73) Assignee: Kioxia Corporation, Minato-ku (JP)

( * ) Notice: Subject to any disclaimer, the term of this patent is extended or adjusted under 35 U.S.C. 154(b) by 624 days.

(21) Appl. No.: 16/515,274

(22) Filed: Jul. 18, 2019

(65) Prior Publication Data
US 2020/0294960 A1 Sep. 17, 2020

(30) Foreign Application Priority Data

Mar. 15, 2019 (JP) .............................. JP2019-048423

(51) Int. Cl.
| | |
|---|---|
| *H01L 23/00* | (2006.01) |
| *B23K 1/008* | (2006.01) |
| *B23K 1/20* | (2006.01) |
| *B23K 101/40* | (2006.01) |

(52) U.S. Cl.
CPC .............. *H01L 24/81* (2013.01); *B23K 1/008* (2013.01); *B23K 1/20* (2013.01); *B23K 2101/40* (2018.08); *H01L 2224/8121* (2013.01); *H01L 2224/81022* (2013.01); *H01L 2224/81048* (2013.01);
(Continued)

(58) Field of Classification Search
None
See application file for complete search history.

(56) References Cited

U.S. PATENT DOCUMENTS

| | | | | |
|---|---|---|---|---|
| 5,249,733 A | * | 10/1993 | Brady ................ | G02B 6/4204 257/E31.118 |
| 6,207,551 B1 | * | 3/2001 | Chungpaiboonpatana ................ | H01L 24/85 438/584 |
| 6,344,407 B1 | | 2/2002 | Matsuki et al. | |

(Continued)

FOREIGN PATENT DOCUMENTS

| | | |
|---|---|---|
| JP | 04-127649 | 11/1992 |
| JP | 2001-244283 | 9/2001 |

(Continued)

OTHER PUBLICATIONS

Samson et al. "Fluxless Chip Join Process using Formic acid in a Continuous Mass Reflow Furnace", IEEE Electronic Components and Technology Conference, 2016, p. 574-579 (Year: 2016).*

*Primary Examiner* — Devang R Patel
(74) *Attorney, Agent, or Firm* — Oblon, McClelland, Maier & Neustadt, L.L.P.

(57) ABSTRACT

According to an embodiment, a temperature of an inside of a furnace is set to fall within a range of a reduction temperature or more of a carboxylic acid and less than a melting temperature of a solder bump, and the inside is concurrently set to have a first carboxylic acid gas concentration. Thereafter, the temperature of the inside is raised up to the melting temperature, and the inside is concurrently set to have a second carboxylic acid gas concentration. The second carboxylic acid gas concentration is lower than the first carboxylic acid gas concentration, and is a concentration containing a minimum amount of carboxylic acid gas defined to achieve reduction on an oxide film of the solder bump. The inside has the second carboxylic acid gas concentration at least at a time when the temperature of the inside reaches the melting temperature.

20 Claims, 5 Drawing Sheets

(52) U.S. Cl.
CPC ............... *H01L 2224/81065* (2013.01); *H01L 2224/81091* (2013.01); *H01L 2224/81815* (2013.01)

(56) References Cited

U.S. PATENT DOCUMENTS

| | | |
|---|---|---|
| 6,666,369 B2 | 12/2003 | Matsuki et al. |
| 8,191,758 B2 | 6/2012 | Sawada et al. |
| 8,302,843 B2 * | 11/2012 | Matsui ................. H01L 24/742 228/102 |
| 8,409,919 B2 | 4/2013 | Aoki et al. |
| 9,513,211 B1 * | 12/2016 | Kobayashi ............ G01N 25/00 |
| 2019/0009375 A1 * | 1/2019 | Hayashi ................... B23K 3/04 |

FOREIGN PATENT DOCUMENTS

| | | |
|---|---|---|
| JP | 2001-244618 | 9/2001 |
| JP | 2011-003765 | 1/2011 |
| JP | 2011-077193 | 4/2011 |
| JP | 2013-065761 | 4/2013 |
| JP | 5885135 | 3/2016 |

* cited by examiner

SEMICONDUCTOR DEVICE MANUFACTURING METHOD

CROSS-REFERENCE TO RELATED APPLICATIONS

This application is based upon and claims the benefit of priority from Japanese Patent Application No. 2019-048423, filed on Mar. 15, 2019; the entire contents of which are incorporated herein by reference.

FIELD

Embodiments described herein relate generally to a semiconductor device manufacturing method.

BACKGROUND

A semiconductor device is known in which plurality of semiconductor chips are stacked and bump electrodes of the stacked semiconductor chips are electrically connected to each other by bumps. It is desired that the bumps have stable connection shapes and the contact interfaces between the bumps and the bump electrodes are removed of oxide films.

DETAILED DESCRIPTION

In general, according to one embodiment, a stacked body is formed by stacking a first semiconductor elemental device that includes a first bump electrode and a solder bump provided on the first bump electrode, and a second semiconductor elemental device that includes a second bump electrode, and temporarily fixing the solder bump and the second bump electrode to each other. Then, gas is exhausted from an inside of a furnace in which the stacked body is placed. Thereafter, an oxide film on a surface of the solder bump is removed, by setting a temperature of the inside of the furnace to fall within a range of a reduction temperature or more at which a carboxylic acid expresses a reduction action, and less than a melting temperature at which the solder bump is melted, and concurrently introducing into the inside of the furnace a reducing gas containing a carboxylic acid gas and an inactive gas such that the inside of the furnace has a first carboxylic acid gas concentration. Then, the temperature of the inside of the furnace is raised up to the melting temperature, and a carboxylic acid gas concentration of the inside of the furnace is concurrently lowered down to a second carboxylic acid gas concentration. Thereafter, a process of connecting the solder bump and the second bump electrode to each other is performed, by keeping the temperature of the inside of the furnace at the melting temperature or more to melt the solder bump. The second carboxylic acid gas concentration is lower than the first carboxylic acid gas concentration, and is a concentration containing a minimum amount of carboxylic acid gas defined to achieve reduction on the oxide film of the solder bump bitten in between the solder bump and the second bump electrode. The inside of the furnace has the second carboxylic acid gas concentration at least at a start point of the process of connecting the solder bump and the second bump electrode to each other.

Exemplary embodiments of a semiconductor device manufacturing method will be explained below in detail with reference to the accompanying drawings. The present invention is not limited to the following embodiments. The sectional views of a semiconductor device used in the following embodiments are schematic, and so the relationship between the thickness and width of each layer and/or the thickness ratios between respective layers may be different from actual states.

First Embodiment

Figure 1A:
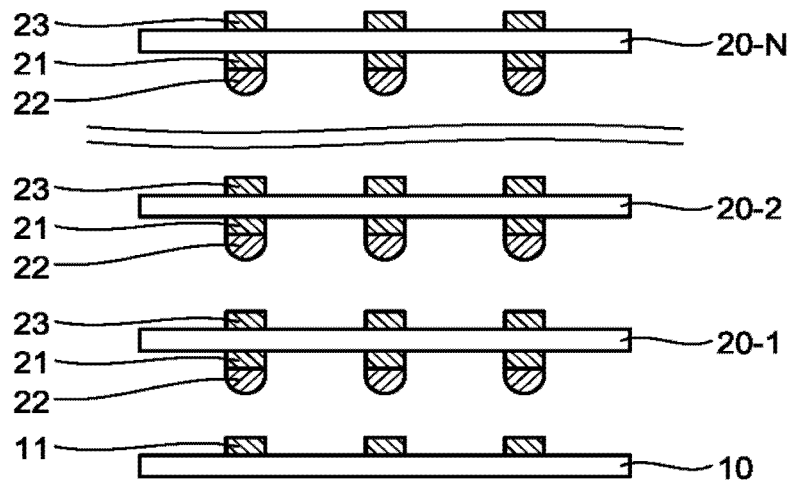
FIGS. 1A to 1C are sectional views schematically illustrating an example of procedures of a semiconductor device manufacturing method according to a first embodiment.
Figure 1B:
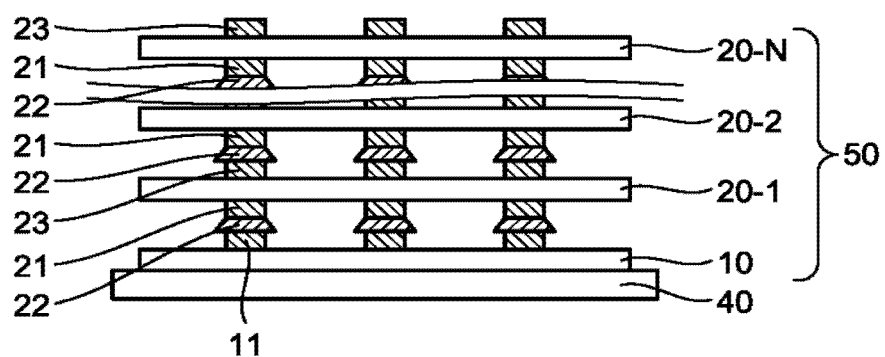
Figure 1C:
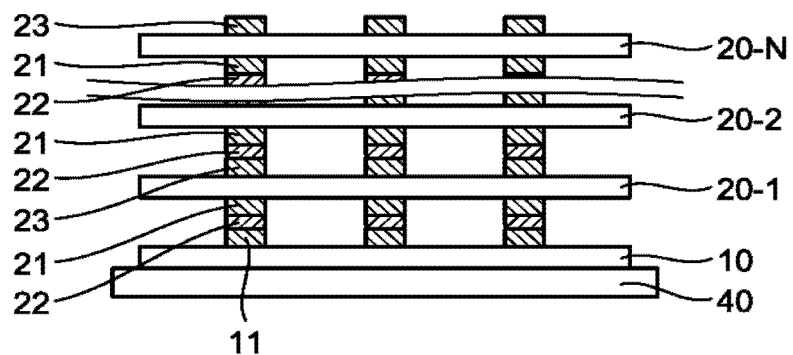
Figure 2A:
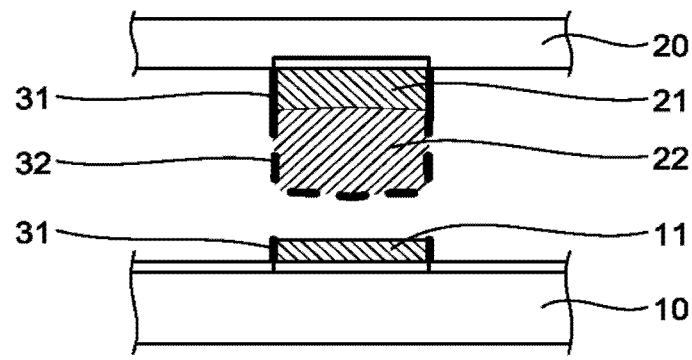
FIGS. 2A to 2C are sectional views schematically illustrating states near a solder bump in the semiconductor device manufacturing method according to the first embodiment.
Figure 2B:
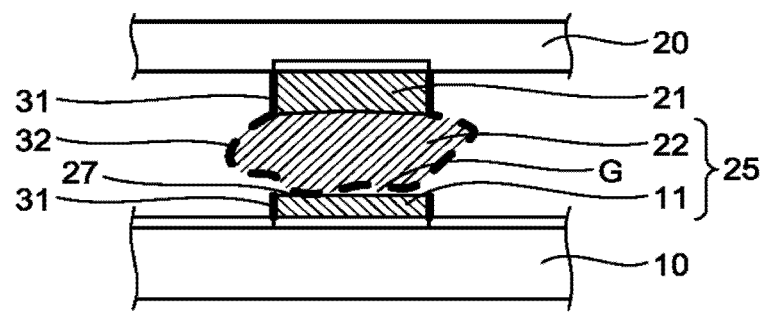
Figure 2C:
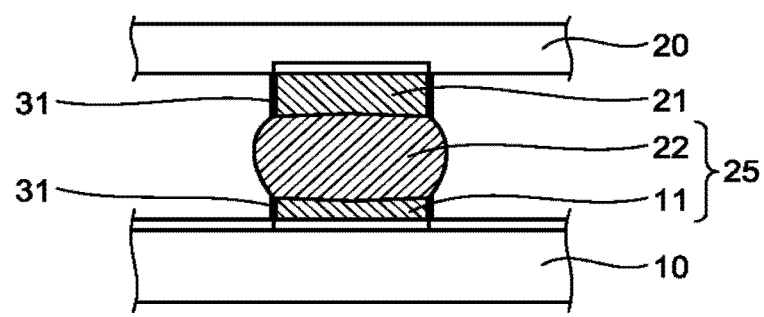
Figure 3:
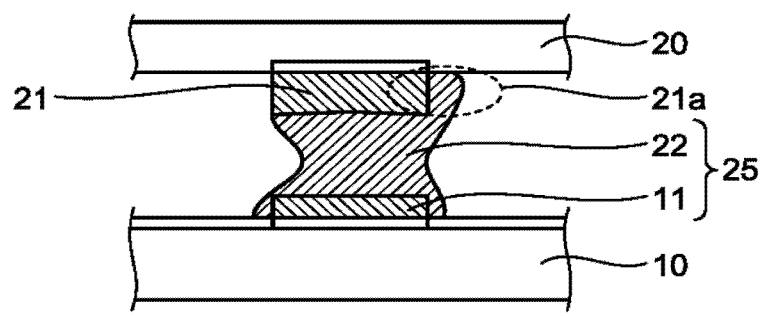
FIG. 3 is a diagram schematically illustrating a state in solder bump connection.

FIGS. 1A to 1C are sectional views schematically illustrating an example of procedures of a semiconductor device manufacturing method according to a first embodiment. FIGS. 2A to 2C are sectional views schematically illustrating states near a solder bump in the semiconductor device manufacturing method according to the first embodiment. FIG. 3 is a diagram schematically illustrating a state in solder bump connection. Each of FIGS. 2A to 2C and 3 illustrates an enlarged view between bump electrodes 11 and 21 arranged between a semiconductor chip 10 and a semiconductor chip 20-1.

As illustrated in FIG. 1A, in manufacturing a semiconductor device, semiconductor chips 10 and 20-1 to 20-N (N is an arbitrary natural number) are prepared, as a plurality of semiconductor elemental devices. Here, a semiconductor chip 10 and a plurality of semiconductor chips 20-1 to 20-N are prepared (hereinafter, when there is no need to distinguish from each other the semiconductor chips 20-1 to 20-N, each one will be simply referred to as "semiconductor chip 20"). The semiconductor chip 10 includes bump electrodes 11 on the upper face, which is one of the faces. The semiconductor chip 20 includes bump electrodes 21 on the lower face, which is one of the faces, together with solder bumps 22 connected onto the bump electrodes 21. The semiconductor chip 20 further includes bump electrodes 23 on the upper face, which is the other of the faces.

Each of the bump, electrodes 11, 21, and 23 is an electrode to serve as a connecting portion that electrically and mechanically connects two semiconductor chips 10 and 20 to each other. The group of bump electrodes 11 is arrayed, for example, in a matrix shape within a predetermined area on the upper face of the semiconductor chip 10. The groups of bump electrodes 21 and 23 are arrayed, for example, each in a matrix shape within a predetermined area, on the lower face and upper face of the semiconductor chip 20, respectively. In this example, each of the bump electrodes 11, 1, and 3 has a flat pad shape. The bump electrodes include a single metal film using a metal selected from the group consisting of Cu, Au, Ni, Pd, and the like, a composite film formed by stacking some of these metals, or an alloy film made from some of these metals.

As illustrated in FIG. 2A, oxide films 31 formed by oxidation of the surfaces of the bump electrodes 11, 21, and 23 are present on the lateral sides of the bump electrodes 11, 21, and 23. The oxide films 31 present on the lateral sides of the bump electrodes 11 and 21 provide a function to prevent wet spreading of molten solder over the lateral sides of the bump electrodes 11 and 21 when the solder bumps 22 are melted. If no oxide films 31 are present on the lateral sides of the bump electrodes 11, 21, and 23, when the solder bumps 22 are melted, as illustrated in FIG. 3, molten solder causes wet spreading over the lateral sides of the bump electrodes 11 and 21. In this case, the solder partly comes around onto the lateral sides of the bump electrodes 11 and 21, and thereby results in a solder bump 22 that has a shape constricted at about its center in the height direction. Further, the parts 21a of the solder coming around onto the lateral sides of the bump electrodes 11 and 21 in this way could form short circuits to those bump electrodes 11 and 21 or solder bumps 22 which are adjacent to the parts 21a in a direction parallel t the faces on which the bump electrodes 11 and 21 are arranged. Accordingly, when the solder bumps 22 are melted, the oxide films 31 on the lateral sides of the bump electrodes 11, 21, and 23 have to be kept without being removed.

The solder bumps 22 are arranged on the respective bump electrodes 21 on the lower face of the semiconductor chip 20, and thus are arrayed, for example, in a matrix shape, as in the bump electrodes 21. For example, the solder bumps 22 are formed by using a plating method, or formed by using fine balls made of a solder alloy. For example, the solder bumps 22 include a single metal selected from the group consisting of Sn, Ag, Cu, Au, Bi, Zn, In, and the like, a composite made of some of these metals, or an alloy made from some of these metals. Immediately after the solder bumps 22 are formed on the bump electrodes 21, no oxide films are present on the surfaces of the solder bumps 22. However, with the lapse of time, as illustrated in FIG. 2A, the surfaces of the solder bumps 22 are oxidized and oxide films 32 are formed thereon. When the solder bumps 22 are connected to the bump electrode 11 and 23, the oxide films 32 formed on the surfaces of the solder bumps 22 become a cause to increase the resistance between the solder bumps 22 and the bump electrodes 11 and 23, or to bring about connection failure between the solder bumps 22 and the bump electrodes 11 and 3. Accordingly, before the solder bumps 22 are melted, the oxide films 32 on the surfaces of the solder bumps 22 are required to be removed as far as possible.

Each of the semiconductor chip 10 and the semiconductor chip 20 is, for example, a silicon (Si) chip or the like, but at least one of these chips 10 and 20 may be formed of an Si interposer. In other words, the combination of a first semiconductor elemental device and a second semiconductor elemental device encompasses not only a combination of the semiconductor chip 10 and the semiconductor chip 20, but also a combination of an Si interposer and the semiconductor chip 10 or 20, a combination of the semiconductor chip 10 or 20 and an Si interposer, and so forth, and thus is not limited to a specific one.

Then, as illustrated in FIG. 1B, the semiconductor chip 10 is mounted onto a support board 40. Thereafter, positioning is performed such that the bump electrodes 11 of the semiconductor chip 10 are aligned with the solder bumps 22 of the semiconductor chip 20-1, and then the semiconductor chip 20 is stacked onto the semiconductor chip 10. At this time, the bump electrodes 11 and the solder bumps 22 are temporarily fixed to each other. It suffices that this temporary fixing attains such a strength that prevents the lower and upper semiconductor chips 10 and 20-1 from coming off each other when oxide film removal is performed in a subsequent step. For this temporary fixing between the bump electrodes 11 and the solder bumps 22, there is a fixing method that uses bonder of a pulse-heater heating type to apply a load together with heating at a temperature lower than the melting point of the solder bumps 22, or a method that additionally uses a photosensitive adhesive or nonconductive adhesive as a fixing material (not illustrated). Here, the support board 40 is formed of, for example, a lead frame or glass epoxy board.

Thereafter, the solder bumps 22 of the semiconductor chip 20-2 are temporarily fixed to the bump electrodes 23 of the semiconductor chip 20 already temporary fixed to the semiconductor chip 10, by using substantially the same method. This operation is repeated until the semiconductor chip 20-N is temporary fixed. Consequently, a stacked body 50 is obtained in which the semiconductor chips 10 to 20-N are temporary fixed to each other.

Then, the stacked body 50 thus prepared by the temporary fixing as illustrated in FIG. 1B is subjected to a reduction reflow process for really bonding the solder bumps 22 to the bump electrodes 11 and 23, as illustrated in FIG. 1C. The temporary fixing between the bump electrodes 11 and 23 and the solder bumps 22, which belong to the semiconductor chips 10 and 20 adjacent to each other in the vertical direction, is performed in a state with the oxide films 32 present on the surfaces of the solder bumps 22. Consequently, in the state obtained by the temporary fixing, the oxide films 32 are bitten in at the contact interfaces between the bump electrodes 11 and 23 and the solder bumps 22. However, as illustrated in FIG. 2B, as the bump electrodes 11 and the solder bumps 22 are in a temporary fixed state, there is a gap G at each of the contact interfaces between the bump electrodes 11 and the solder bumps 22. In consideration of the above, the solder bumps 22 are melted after the oxide films 32 present on the surfaces of the solder bumps 22 are removed by bringing a carboxylic acid gas into contact therewith. In this embodiment, this melting is performed under an atmosphere with the carboxylic acid gas present therein, and the reduction reflow process is thereby performed to melt the solder bumps 22 while removing the oxide films 32 bitten in at the contact interfaces. Next, an explanation will be given of this reduction reflow process.

Figure 4:
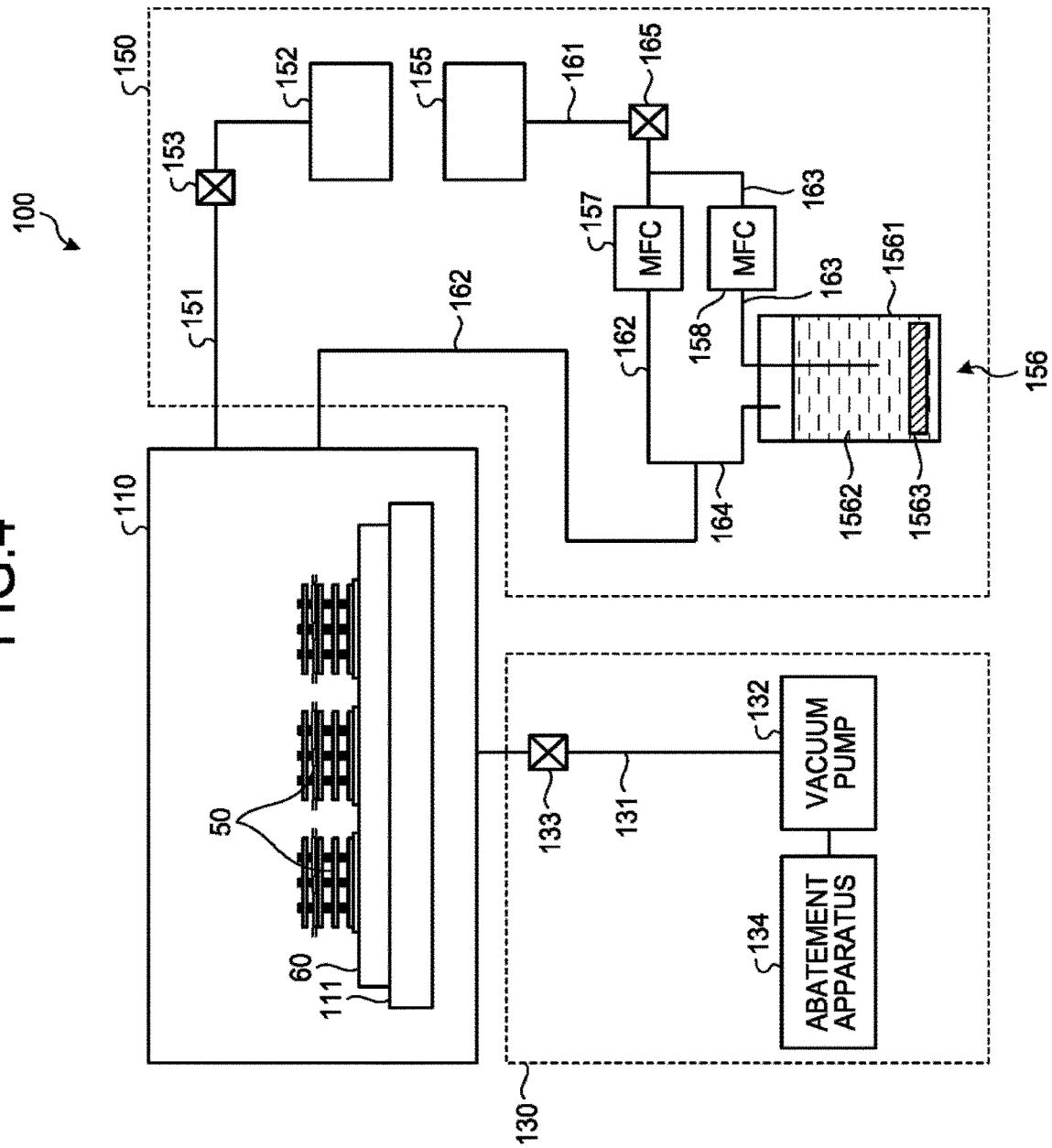
FIG. 4 is a diagram schematically illustrating a configuration example of a reduction reflow processing apparatus.

FIG. 4 is a diagram schematically illustrating a configuration example of a reduction reflow processing apparatus. The reduction reflow processing apparatus 100 includes a heating furnace 110, an exhaust gas processing section 130, and a gas introducing section 150. The heating furnace 110 has a structure that can be hermetically sealed. The heating furnace 110 includes therein a stage 111 configured to hold a processing object and equipped with a heating mechanism. For example, the stage 111 is configured to mount thereon a carrier plate 60 on which a plurality of stacked bodies 50 prepared by the temporary fixing are placed.

The exhaust gas processing section 130 includes a vacuum pump 132 connected the heating furnace 110 through piping 131 to exhaust gas outside from inside the heating furnace 110, an exhaust valve 133 for switching the ON/OFF of gas exhaustion by the vacuum pump 132, and an abatement apparatus 134 connected to the vacuum pump 132 through the piping 131 to detoxify gas exhausted by the vacuum pump 132.

The gas introducing section 150 includes an inactive gas storage part 152 connected to the heating furnace 110 through piping 151 and storing an inactive gas, and a valve 153 for switching the ON/OFF of supply of the inactive gas to the heating furnace 110. The inactive gas storage part 152 stores an inactive gas, such as nitrogen gas. The passage connected by this piping 151 is used to return the inside of the heating furnace 110 in an exhausted state back to atmospheric pressure to perform opening to the atmosphere.

Further, the gas introducing section 150 includes an inactive gas storage part 155 and a reduction gas generation part 156. The inactive gas storage part 155 stores an inactive gas to be used as a carrier gas in generating a carboxylic acid gas, and also to be used as a dilution gas for adjusting the carboxylic acid gas concentration. As this inactive gas, an inactive gas, such as nitrogen gas, He gas, Ne gas, Ar gas, Kr gas, or Xe gas, may be used. In FIG. 4, the inactive gas storage part 152 and the inactive gas storage part 155 are individually provided. However, where the same gas is used for the inactive gas to be used for opening to the atmosphere and the inactive gas to be used in generating a reducing gas, an inactive gas storage part may be used in common.

The inactive gas storage part 155 is connected to piping 161, which is branched on the way into dilution gas piping 162 and carrier gas piping 163. The dilution gas piping 162 is connected to the heating furnace 110. The dilution gas piping 162 is equipped with a gas flow controller 157 to control the flow rate of the inactive gas used as a dilution gas to be introduced into the heating furnace 110. The carrier gas piping 163 is equipped with a gas flow controller 158 to control the flow rate of the inactive gas used as a carrier gas to be introduced into the reduction gas generation part 156. As the gas controllers 157 and 158, a mass flow controller or the like may be used. The carrier gas piping 163 is connected to the reduction gas generation part 156. Further, the piping 161 is equipped with a valve 165 for switching the ON/OFF of supply of the inactive gas.

The reduction gas generation part 156 is formed of a hermetically sealed container 1561 that stores carboxylic acid liquid 1562. The hermetically sealed container 1561 is connected to the carrier gas piping 163, and mixture gas piping 164 for introducing into the heating furnace 110 a mixture gas that has been generated in the hermetically sealed container 1561 and contains a carboxylic acid vapor and the carrier gas. The distal end of the carrier gas piping 163 is positioned in the carboxylic acid liquid 1562. Further, one end of the mixture gas piping 164 is arranged inside the hermetically sealed container 1561 without contact with the carboxylic acid liquid 1562, and the other end is connected to the dilution gas piping 162. Where the carboxylic acid itself is liquid, the carboxylic acid liquid 1562 may be this liquid. Alternatively, the carboxylic acid liquid 1562 may be a carboxylic acid solution containing a carboxylic acid in a predetermined concentration. The reduction gas generation part 156 includes a heating member 1563 for heating the carboxylic acid liquid 1562. The heating member 1563 is configured to heat the hermetically sealed container 1561, for example. When the hermetically sealed container 1561 is heated, a carboxylic acid vapor is generated within the hermetically sealed container 1561. The mixture gas in the mixture gas piping 164 is mixed with the dilution gas in the dilution gas piping 162, and a reducing gas containing the carboxylic acid gas in a predetermined concentration is thereby formed, and is then supplied into the heating furnace 110.

The carboxylic acid gas is used to remove by reduction the oxide films 32 present on the surfaces of the solder bumps 22. The carboxylic acid to be used as a reduction agent for the oxide films 32 is not limited to a specific one, and may be an aliphatic monovalent or divalent lower carboxylic acid selected from the group consisting of formic acid, acetic acid, acrylic acid, propionic acid, oxalic acid, succinic acid, malonic acid, and the like, for example. Of these acids, formic acid is preferably used, because formic acid is lower in cost of itself and in gasifying cost and is better in reduction action to the oxide films 32. Hereinafter, an explanation will be mainly given of a case where formic acid is used as a representative example of the carboxylic acid; however, the carboxylic acid used as a reduction agent for the oxide films 32 is not limited to this example. Further, the reduction gas generation part 156 has a configuration that utilizes a bubbling system as an example; however, this part 156 may have a another configuration that utilizes a baking system or direct vaporizing system, as long as the part 156 can supply a carboxylic acid vapor into the heating furnace 110.

Figure 5:
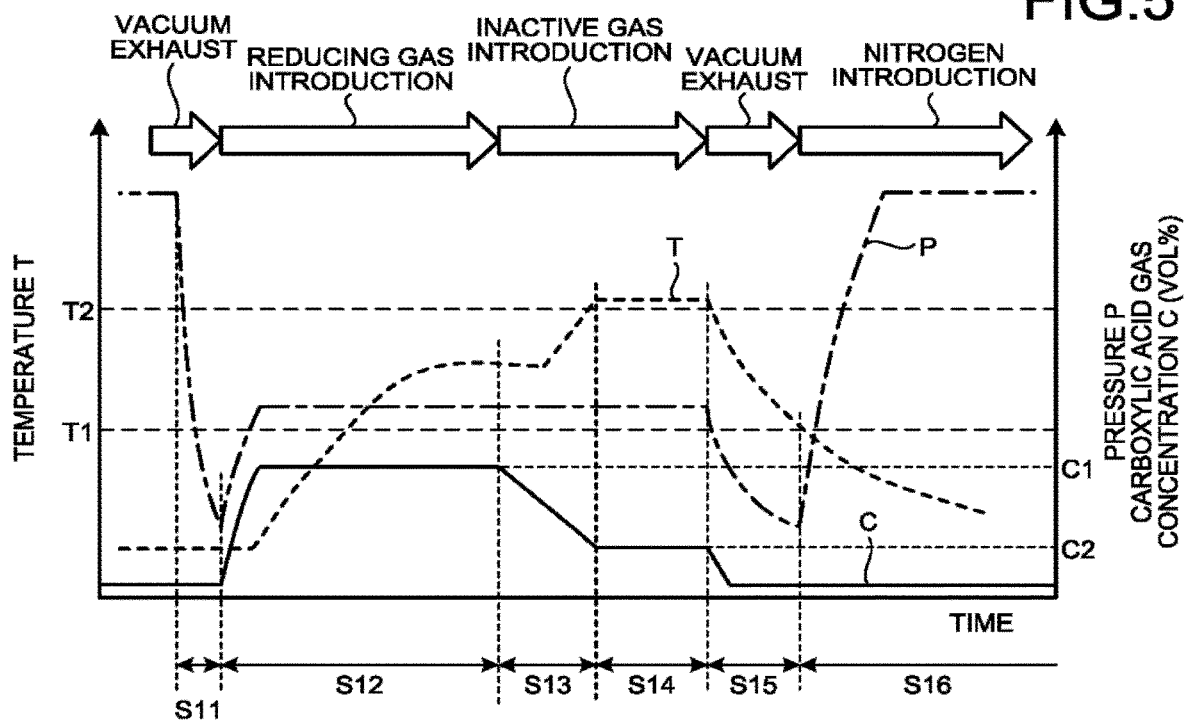
FIG. 5 is a diagram illustrating an example of conditions of a reduction reflow process according to the first embodiment.

Next, an explanation will be given of a reduction reflow process according to the first embodiment in the reduction reflow processing apparatus 100 illustrated in FIG. 4. FIG. 5 is a diagram illustrating an example of conditions of the reduction reflow process according to the first embodiment. In FIG. 5, the horizontal axis indicates time, the left vertical axis indicates temperature, and the right vertical axis indicates the pressure and the carboxylic acid gas concentration (vol %) inside the heating furnace 110.

First, a plurality of stacked bodies 50, each in a state mounted on the support board 40 and temporary fixed, are placed on the carrier plate 60, which is then mounted onto the stage 111 inside the heating furnace 110 (reflow furnace). Thereafter, in order to set the inside of the heating furnace 110 to have a decompressed atmosphere, a gas exhausting process of exhausting gas from inside the heating furnace 110 is performed by the vacuum pump 132 (step S11). As oxygen remaining inside the heating furnace 110 in heating oxidizes the solder bumps 22, the gas exhaust from inside the heating furnace 110 is preferably performed to change an atmospheric pressure state ($1.01 \times 10^5$ Pa) down to a decompressed state of $1 \times 10^3$ Pa or less, and more preferably of about 5 Pa.

Then, a carboxylic acid gas used as a reducing gas is introduced into the heating furnace 110 having such a decompressed atmosphere, to perform a reduction process of reducing the oxide films of the solder bumps 22 (step S12). In this reduction process, the heating mechanism of the stage 111 is operated to apply heat such that the temperature inside the heating furnace 110 falls within a temperature range of a reduction temperature T1 or more at which the carboxylic acid gas expresses a reduction action, and less than the melting point T2 of the solder bumps 22. Further, the pressure inside the heating furnace 110 is kept at a predetermined value, and the carboxylic acid concentration is kept at a predetermined value C1. Next, a specific explanation will be given of this reduction process.

As illustrated in FIG. 4, the heating member 1563 is operated to heat the carboxylic acid solution stored in the hermetically sealed container 1561 of the reduction gas generation part 156, and thereby to generate a carboxylic acid vapor inside the hermetically sealed container 1561. The carrier gas is made to flow from the carrier gas piping 163 into the hermetically sealed container 1561 in this state, and a mixture gas of the carrier gas with the carboxylic acid vapor is thereby sent out from the mixture gas piping 164. As the carrier gas, nitrogen gas, He gas, Ne gas, Ar gas, Kr gas, Xe gas, or the like may be used.

The mixture gas piping 164 is connected to the dilution gas piping 162, and so the mixture gas meets up with the dilution gas. As the inactive gas flowing through the dilution gas piping 162 is mixed with the mixture gas, a reducing gas is generated in a state where its carboxylic acid gas concentration has been adjusted. Then, the reducing gas is introduced into the heating furnace 110. The dilution gas is a gas for adjusting the carboxylic acid gas concentration. In the dilution gas piping 162, the flow rate of the dilution gas is adjusted by the gas flow controller 157 to attain the carboxylic acid concentration necessary for reduction of the oxide films present on the solder bumps 22 inside the heating furnace 110. The flow rate of the carrier gas is adjusted by the gas flow controller 158. As the dilution gas, an inactive gas is used, a in the carrier gas. As the dilution gas, nitrogen gas or the like may be used, but the same gas as the carrier gas may be used.

Here, experiments have been performed to obtain such information in advance that correlates the carboxylic acid gas concentration inside the heating furnace 110 when the inside of the heating furnace 110 has a predetermined pressure, with the inactive gas flow rates at the gas flow controllers 157 and 158, and the opening degree of the exhaust valve 133. Then, in accordance with this correlating information, when the reducing gas is to be introduced into the heating furnace 110, the inactive gas flow rates at the gas flow controllers 157 and 158 are controlled, and the pressure inside the heating furnace 110 is adjusted by operating the exhaust valve 133, so that the carboxylic acid gas concentration inside the heating furnace 110 is controlled.

Accordingly, the reducing gas is introduced always in a renewed state into the heating furnace 110. Further, the ambient pressure inside the heating furnace 110 is preferably set to be kept in a state lower than atmospheric pressure, such as within a range of 1.3 to $8 \times 10^4$ Pa. If the pressure inside the heating furnace 110 is too low, the solder bumps 22 could be unmelted because of insufficient heating caused by vacuum insulation. If this pressure is about atmospheric pressure, out gas containing the carboxylic acid gas could be involved into solder and form void defects. According to the setting described above, gas generated by reduction of the oxide films 32 by using the reducing gas can diffuse around without staying, and thus the gas generated by reduction is suppressed from being taken into bonded bodies (connected bodies) of the solder bumps 22 with the bump electrodes 11 and 23. Specifically, the ambient pressure mentioned above is preferably set to $2.7 \times 10^4$ Pa or less, for example, although it depends on the introduction amount of the carboxylic acid gas.

When the carboxylic acid gas in a predetermined existential quantity (concentration) is preset under a decompressed atmosphere of $1.3 \times 10^4$ Pa or more and $8 \times 10^4$ Pa or less, the oxide films 32 on the surfaces of the solder humps 22 can be removed by reduction. For example, in a case where the pressure inside the heating furnace 110 is $2.7 \times 10^4$ Pa, the reducing gas is preferably introduced to set the carboxylic acid gas concentration to fall within a range of 0.6 vol % to 9.2 vol %. When this carboxylic acid gas concentration is converted into a mol concentration of formic acid, for example, the concentration falls within a range of $3.19 \times 10^{-6}$ mol/L to $2.87 \times 10^{-3}$ mol/L.

If the carboxylic acid gas concentration inside the heating furnace 110 during the reduction process step is too high, superfluous part of the carboxylic acid gas could be taken into the solder bumps 22 in a molten state and from voids. On the other hand, if the carboxylic acid gas concentration is too low, the reduction action to the oxide films 32 obtained by the carboxylic acid gas could be insufficient, thereby causing connection failure and resistance value increase in the solder bumps 22. Accordingly, the carboxylic acid gas concentration is preferably set to fall within the range mentioned above.

After the reducing gas is introduced into the heating furnace 110 having the ambience described above, or almost simultaneously with the time when the reducing gas is introduced, the temperature inside the heating furnace 110 is raised by the heating mechanism of the stage 111 at a predetermined rate of temperature increase (for example 20 to 50° C./min). At this time, the temperature inside the heating furnace 110 is controlled to fall within a temperature range of the reduction temperature T1 or more at which the carboxylic acid expresses a reduction action, and less than the melting point T2 of the solder bumps 22.

Where formic acid is used as the carboxylic acid, this acid expresses a reduction action to the oxide films 32 at a temperature of 150° C. or more. Accordingly, the reduction temperature T1 for the oxide films 32 by formic acid is about 150° C., and the oxide films 32 are removed by reduction at or above this temperature. At a temperature within such a range of the reduction temperature T1 or more for the oxide films 32, the solder bumps 22 are exposed in formic acid gas for several minutes, for example, so that the oxide films present on the surfaces of the solder bumps 22 can be removed by reduction.

However, the number of solder bumps 22 arranged on each of the semiconductor chips 20, which constitute the stacked body 50 prepared by the temporary fixing, exceeds 1,000, because of minimization of bump sizes, miniaturization of bump pitches, and the like. The processing object of the reduction reflow process is the stacked body 50 formed of the stacked semiconductor chips 20 including a large number of such solder bumps 22. Further, a plurality of stacked bodies 50 are subjected to the reduction reflow process together at a time inside the heating furnace 110, and thus the total number of solder bumps 22 exceeds 800,000, as the case may be. As the oxide films 32 of these solder humps 22 before start of the reduction are in states not the same as each other, a sufficient reduction process time is required to remove the oxide films on all the solder bumps 22 in their entirety.

On the other hand, if reduction is applied to the oxide films 31 on the lateral sides of the bump electrodes 11, 21, and 23 other than the bonded bodies 25 of the solder bumps 22 necessary for bump connection, solder of the solder bumps 22 causes wet spreading over the lateral sides of the bump electrodes 11, 21, and 23, as illustrated in FIG. 3, and decreases the solder volume necessary for connection of the bonded bodies 25. In this respect, a method may be assumed that uses conditions including a constant carboxylic acid gas concentration and set for a lower reduction power to suppress wet spreading of molten solder over the lateral sides of the bump electrodes 11, 21 and 23. However, this method needs a longer time to process the solder bumps 22 by reduction, and thus is expected to cause harmful effects on connection of the solder bumps 22 due to the thermal history. Further, in this case, for example, solid-phase diffusion of metal could be developed at a low temperature, thereby first forming a metal compound having a high melting point, which would hinder the solder bumps 22 from being melted at the melting point T2.

In light of the above, according to the first embodiment, a process following the reduction process has been arranged such that, even after the reduction process, it is possible to remove the remaining oxide films 32 unreduced between the solder bumps 22 and the bump electrodes 11 and 23, without reducing the oxide films 31 on the lateral sides of the bump electrodes 11, 21, and 23. Specifically, the atmosphere inside the heating furnace 110 is controlled such that, even in a melting process to the solder bumps 22 after the reduction process, the reducing gas is present inside the heating furnace 110.

After the reduction process step of step S12, a temperature increase process is performed to raise the temperature inside the heating furnace 110 to the melting point (melting temperature) T2 or more of the solder bumps (step S13). In the temperature increase process, while the temperature is within a range of the reduction temperature T1 or more for the oxide films by the carboxylic acid gas and less than the melting point T2 of the solder bumps 22, the carboxylic acid gas concentration is made lowered. Specifically, the gas flow controllers 157 and 158 are operated to perform control to increase the ratio of the flow rate of the inactive gas flowing through the dilution gas piping 162 relative to the mixture gas. Consequently, the carboxylic acid gas concentration inside the heating furnace 110 can be lowered. As described above, the carboxylic acid gas concentration inside the heating furnace 110 is not set to zero, but is lowered to a predetermined value C2. The predetermined value C2 corresponds to the minimum value of the carboxylic acid gas concentration defined to achieve reduction on the oxide films 32 bitten in between the solder bumps 22 and the bump electrodes 11 and 23 until the end point of the temperature increase step (the start point of the subsequent melting step). Here, the exhaust valve 133 is controlled to set the ambient pressure inside the heating furnace 110 to be constant, for example, to be in a state of $2.7 \times 10^4$ Pa.

Where formic acid is used as the carboxylic acid, for example, at the reduction temperature T1 or more, the flow rate ratio of the dilution gas relative to the mixture gas containing formic acid gas is controlled to set the formic acid gas concentration to 2.8 vol %, and the reducing gas thus obtained is made to flow at a rate of 15 L/min, for example. Thereafter, at the time when the temperature inside the heating furnace 110 reaches the melting point T2 of the solder bumps 22, the flow rate ratio of the dilution gas relative to the mixture gas containing formic acid gas is controlled to set the formic acid gas concentration to 0.6 vol % or more, and the reducing gas thus obtained is made to flow at a rate of 30 L/min, for example. Here, the formic acid gas concentration is a mere example, and this concentration is preferably set to 2.8 vol % to 9.2 vol % at the reduction temperature T1 or more, and is preferably set to 0.6 vol % to 2.8 vol % at the time when the temperature reaches the melting point 12 of the solder bumps 22. In this way, the formic acid gas concentration inside the heating furnace 110 is lowered stepwise. In the case of this setting, the formic acid gas concentration is lowered at −0.7 vol %/min. However, the entire pressure inside the heating furnace 110 is controlled not to change.

Thereafter, while the temperature inside the heating furnace 110 is kept at the melting point T2 of the solder bumps 22 or more, a melting process is performed to melt the solder bumps 22 (step S14). At the start point of the melting process, as described above, the inside of the heating furnace 110 has been set to the minimum value of the carboxylic acid gas concentration defined to achieve reduction on the oxide films 32 bitten in between the solder bumps 22 and the bump electrodes 11 and 23. Also during the melting process, the entire pressure inside the heating furnace 110 is controlled not to change.

According the Ellingham diagram in which standard reaction Gibbs energy in oxidation reaction is plotted with respect to temperature, as the solder bumps 22 are formed by using, for example, a metal selected from the group consisting of Sn, Ag, Cu, Au, Si, Zn, In, and the like, a composite film made of some of these metals, or an alloy made from some of these metals, the solder bumps 22 is made of a metal mainly of Sn that can be hardly reduced. However, in this method, the carboxylic acid gas, which expresses a reduction action at the reduction temperature T1 or more, is used, and thus the oxide films are removed at a low temperature within a range of less than the melting point T2 of the solder bumps 22. On the other hand, as the bump electrodes 11, 21, and 23 are formed by using, for example, a single metal selected from the group consisting of Cu, Au, Ni, Pd, and the like, a composite film of some of these metals, or an alloy of some of these metals, the bump electrodes tend to be easily reduced at a high temperature. In consideration of the above, after the oxide films 32 on the surfaces of the solder bumps 22 are almost removed by the reduction process, the temperature is set to the melting point T2 of the solder bumps 22, in a state where the carboxylic acid gas concentration inside the heating furnace 110 is set lower, so that the oxide films 31 of the bump electrodes 11, 21, and 23 can be suppressed from being reduced.

Further, depending on the state illustrated in FIG. 2B where the stacked body 50 has been prepared by the temporary fixing, there may be a case where the carboxylic acid gas cannot intrude into some of the gaps G at the contact interfaces 27 between the bump electrodes 11 and the solder bumps 22 at a temperature of less than the melting point T2. Specifically, this is a state where a solder bump 22 is deformed and covers a bump electrode 11 or 23. When the solder bumps 22 are being melted at the melting point T2 or more, the solder bumps 22 change their solder shapes to allow the carboxylic acid gas to intrude, and thus the oxide films 32 of the solder bump 22 can be continuously removed. Accordingly, the inside of the heating furnace 110 is set in a state temporarily having reducibility at least at the start point of the melting process. Specifically, the carboxylic acid gas concentration at the time when the temperature inside the heating furnace 110 reaches the melting point 12 is controlled to have the minimum value of the concentration with which the oxide films 32 between the bump electrodes 11 and 23 and the solder bumps 22 can be removed, and to be smaller than the carboxylic acid gas concentration at the reduction temperature T1.

Here, at the end time point of the melting process, the carboxylic acid gas concentration may have the minimum value with which the oxide films 32 can be removed, or the carboxylic acid gas concentration may have a value less than the minimum value. Where formic acid is used as the carboxylic acid, it suffices that the carboxylic acid gas concentration is 0.6 vol % or more at the time when the temperature reaches the melting point T2, for example.

When the temperature is set to the melting point T2 or more within the atmosphere inside the heating furnace 110 described above, the bump electrodes 11 and 23 and the solder bumps 22 are unified to form the bonded bodies 25. At this time, as the solder bumps 22 are melted while the oxide films 31 of the bump electrodes 11 and 23 remain, the molten solder forms connection shapes of the solder bumps 22 in a state stable in energy without causing wet spreading over the lateral sides of the bump electrodes 11 and 23. A stable connection shape of the solder bumps 22 is a spherical shape, for example. As a result, as illustrate FIG. 21, a semiconductor device can be obtained from the stacked body 50 that has achieved electrically and mechanically good connection between the semiconductor chips 10 and 20.

Thereafter, a gas exhausting process is performed (step S15). In the gas exhausting process, the heating by the heating mechanism of the stage 111 is stopped, the supply of the reducing gas into the heating furnace 110 is stopped, and gas is exhausted from inside the heating furnace 110 by the vacuum pump 132.

After the temperature inside the heating furnace 110 is lowered to a temperature, such as about 50° C., at which the stacked bodies 50 can be easily taken out, an opening-to-atmosphere process is performed (step S16). In the opening-to-atmosphere process, an inactive gas, such as nitrogen gas, is introduced into the heating furnace 110 from the inactive gas storage part 152 through the piping 151, to return the inside of the heating furnace 110 back to atmospheric pressure. Thereafter, the carrier plate 60 with the plurality of stacked bodies 50 placed thereon is unloaded from the heating furnace 110. This returning of the inside of the heating furnace 110 back to atmospheric pressure may be performed after the temperature is lowered to a temperature at which the stacked bodies 50 can be easily taken out, as described above. Alternatively, after the reduction process ends, in a state where the temperature inside the heating furnace 110 is within a range of the melting point 12 of the solder bumps 22 or more, an inactive gas, such as nitrogen gas, may be introduced into the heating furnace 110 at once to return the inside of the heating furnace 110 back to atmospheric pressure.

Each stacked body 50 taken out from the heating furnace 110 is sent to an assembling step, as in ordinary semiconductor devices. The assembling step can be selected in accordance with a semiconductor device, and thus is not limited to a specific one. However, for example, the stacked body 50 is bonded onto a wiring board (not illustrated) by a thermosetting resin, which is cured by a curing process, and then the stacked body 50 is connected to the board (not illustrated) by wire bonding or the like. Thereafter, the structure thus obtained is subjected to resin molding, and is then provided with outer balls to from outer connection terminals of a semiconductor device (semiconductor package).

In the first embodiment, when the reduction reflow process is performed to the stacked body 50, which has been prepared by temporary fixing between the bump electrodes 11 and 23 of semiconductor chips 10 and 20 and the solder bumps 22 of other semiconductor chips 20, a carboxylic acid gas is introduced into the heating furnace 110, while the temperature is within a range of the reduction temperature T1 or more of the carboxylic acid gas and less than the melting point T2 of the solder bumps 22. Thereafter, at the time point when the temperature inside the heating furnace 110 reaches the melting point T2 of the solder bumps 22, the carboxylic acid gas concentration is set to the minimum value defined to achieve reduction on the oxide films 32 of the solder bumps 22 sandwiched between the solder bumps 22 and the bump electrodes 11 and 23, Consequently, when the solder bumps 22 are being melted, the reduction is developed on the oxide films 32 remaining on the solder bumps 22 while the reduction is suppressed on the oxide films 31 present on the lateral sides of the bump electrodes 11 and 23. As a result, it is possible to form the solder bumps 22 into stable connection shapes, while preventing a decrease of the solder volume necessary for connection between the bump electrodes 11 and 23 and the bump electrodes 21. Further, as the solder on the connection surface can be given a sufficient heating time necessary for alloy layer growth, it is possible to increase the connection strength of the solder bumps 22.

Second Embodiment

Figure 6:
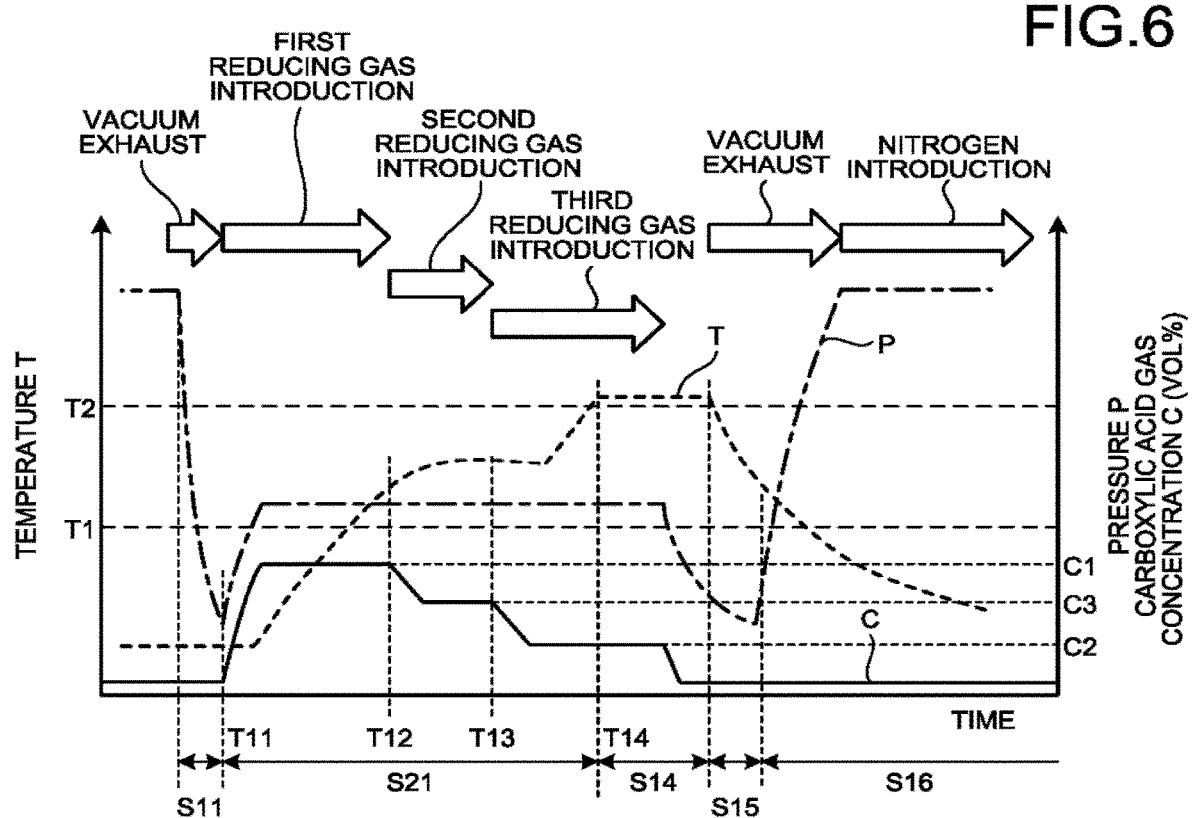
FIG. 6 is a diagram illustrating an example of conditions of a reduction reflow process according to a second embodiment.

FIG. 6 is a diagram illustrating an example of conditions of a reduction reflow process according to a second embodiment. In FIG. 6, the horizontal axis indicates time, the left vertical axis indicates temperature, and the right vertical axis indicates the pressure and the carboxylic acid gas concentration (vol %) inside the heating furnace 110. Hereinafter, an explanation will be given only of parts different from FIG. 5 according to the first embodiment.

In the second embodiment, the reduction process of step S12 and the temperature increase process of step S13 in FIG. 5 are combined as one reduction process (step S21). In this reduction process, while the temperature is within a range of the reduction temperature T1 or more of the carboxylic acid gas and less than the melting point T2 of the solder bumps 22, the reducing gas concentration is changed such that the carboxylic acid gas concentration is lowered stepwise. For example, as illustrated in FIG. 6, a first reducing gas is introduced with the carboxylic acid gas concentration at C1 between the time points T11 to T12, a second reducing gas is introduced with the carboxylic acid gas concentration at C3 between the time points 112 to T13, and a third reducing gas is introduced with the carboxylic acid gas concentration at C2 between the time points T13 to T14. Here, the degrees of the carboxylic acid gas concentration is set to C1>C3>C2. The switching times for introduction of the reducing gases different in concentration and the carboxylic acid gas concentration of the reducing gases to be introduced are arbitrarily set depending on the forms of the bump electrodes 11 and 23 and the solder bumps 22. Here, there is no limit in the number of times and the concentration about this introduction of the reducing gases. Specifically, it suffices that the carboxylic acid gas concentration is lowered stepwise in an m-number of steps ("m" is a natural number of 2 or more) such that the carboxylic acid gas concentration has the minimum value defined to achieve reduction on the oxide films 32 of the solder bumps 22 sandwiched between the solder bumps 22 and the bump electrodes 11 and 23, at the time when the temperature inside the heating furnace 110 reaches the melting point T2.

Also in the second embodiment, an effect substantially the same as that of the first embodiment can be obtained.

The explanations described above have been given of a case where the solder bumps 22 are provided on the bump electrodes 21 of the semiconductor chip 20 on one side, as illustrated in FIGS. 1A to 1C and 2A to 2C. However, the solder bumps 22 may be provided on the bump electrodes 11, 21, and 23 of the semiconductor chips 10 and 20 on both sides. Similarly, this modification may be applied to connection between a glass epoxy board including the bump electrodes 11, 21, and 23 and a semiconductor chip 20 including the solder bumps 22, or connection between a glass epoxy board including the solder bumps 22 and a semiconductor chip including the bump electrodes 11, 21, and 23. Also in these cases, when the reduction reflow process is performed by using substantially the same method, it is possible to form bonded bodies having stable connection shapes by sets of two solder bumps 22.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device manufacturing method comprising:
forming a stacked body by stacking a first semiconductor elemental device and a second semiconductor elemental device, the first semiconductor elemental device including a first bump electrode, a first oxide film formed on a lateral side of the first bump electrode, and a solder bump provided on the first bump electrode, the second semiconductor elemental device including a second bump electrode and a second oxide film formed on a lateral side of the second bump electrode, the stacked body being formed by temporarily fixing the solder bump and the second bump electrode to each other;
exhausting gas from an inside of a furnace in which the stacked body is placed;
performing a reduction process of removing a third oxide film on a surface of the solder bump without removing the first oxide film and the second oxide film, the reduction process being performed by setting a temperature of the inside of the furnace to fall within a range of a reduction temperature or more at which a carboxylic acid expresses a reduction action, and less than a melting temperature at which the solder bump is melted, and concurrently introducing into the inside of the furnace a reducing gas containing a carboxylic acid gas and an inactive gas such that the inside of the furnace has a first carboxylic acid gas concentration;
performing a temperature increase process of raising the temperature of the inside of the furnace up to the melting temperature, and concurrently lowering a carboxylic acid gas concentration of the inside of the furnace down to a second carboxylic acid gas concentration; and
performing a melting process of connecting the solder bump and the second bump electrode to each other without removing the first oxide film and the second oxide film, the melting process being performed by keeping the temperature of the inside of the furnace at the melting temperature or more to melt the solder bump,
wherein the second carboxylic acid gas concentration is lower than the first carboxylic acid gas concentration, and is a concentration containing a minimum amount of carboxylic acid gas defined to achieve reduction on part of the third oxide film of the solder bump bitten in between the solder bump and the second bump electrode, and
the inside of the furnace has the second carboxylic acid gas concentration at least at a start point of the melting process.

2. The semiconductor device manufacturing method according to claim 1, wherein the inside of the furnace has a carboxylic acid gas concentration equal to the second carboxylic acid gas concentration at an end point of the melting process.

3. The semiconductor device manufacturing method according to claim 1, wherein the inside of the furnace has a carboxylic acid gas concentration less than the second carboxylic acid gas concentration at an end point of the melting process.

4. The semiconductor device manufacturing method according to claim 1, wherein a pressure of the inside of the furnace is kept at a predetermined pressure lower than atmospheric pressure during a period from the reduction process to the melting process.

5. The semiconductor device manufacturing method according to claim 4, wherein the pressure falls within a range of $1.3 \times 10^4$ Pa or more and $8 \times 10^4$ Pa or less.

6. The semiconductor device manufacturing method according to claim 1, wherein the first carboxylic acid gas concentration is 0.6 vol % or more and 9.2 vol % or less.

7. The semiconductor device manufacturing method according to claim 6, wherein the first carboxylic acid gas concentration is 2.8 vol % to 9.2 vol %, and the second carboxylic acid gas concentration is 0.6 vol % to 2.8 vol %.

8. The semiconductor device manufacturing method according to claim 1, wherein each of the first bump electrode and the second bump electrode is made of a single metal selected from the group consisting of Ni, Cu, Au and Pd, or a composite film formed by stacking two or more metals selected from the group consisting of Ni, Cu, Au and Pd, and
the solder bump is made of Sn or an alloy containing Sn.

9. The semiconductor device manufacturing method according to claim 1, wherein the carboxylic acid gas contains a carboxylic acid that is an aliphatic monovalent or divalent lower carboxylic acid.

10. The semiconductor device manufacturing method according to claim 9, wherein the lower carboxylic acid contains at least one selected from the group consisting of formic acid, acetic acid, acrylic acid, propionic acid, oxalic acid, succinic acid, and malonic acid.

11. A semiconductor device manufacturing method comprising:
forming a stacked body by stacking a first semiconductor elemental device and a second semiconductor elemental device, the first semiconductor elemental device including a first bump electrode, a first oxide film formed on a lateral side of the first bump electrode, and a solder bump provided on the first bump electrode, the second semiconductor elemental device including a second bump electrode and a second oxide film formed on a lateral side of the second bump electrode, the stacked body being formed by temporarily fixing the solder bump and the second bump electrode to each other;
exhausting gas from an inside of a furnace in which the stacked body is placed;
performing a reduction process of removing a third oxide film on a surface of the solder bump without removing the first oxide film and the second oxide film, the reduction process being performed by raising a temperature of the inside of the furnace up to a melting temperature at which the solder bump is melted, and concurrently introducing a carboxylic acid gas and an inactive gas into the inside of the furnace;
performing a melting process of connecting the solder bump and the second bump electrode to each other without removing the first oxide film and the second oxide film, the melting process being performed by keeping the temperature of the inside of the furnace at the melting temperature or more to melt the solder bump; and
lowering the temperature of the inside of the furnace, and exhausting gas from the inside of the furnace, wherein the reduction process includes
introducing into the inside of the furnace the carboxylic acid gas and the inactive gas such that the inside of the furnace has a first carboxylic acid gas concentration after the exhausting gas from the inside of the furnace, and controlling introduction amounts of the carboxylic acid gas and the inactive gas, by lowering stepwise a concentration of the carboxylic acid gas to be a second carboxylic acid gas concentration lower than the first carboxylic acid gas concentration at a start point of the melting process, and the second carboxylic acid gas concentration is lower than the first carboxylic acid gas concentration, and is a concentration containing a minimum amount of carboxylic acid gas defined to achieve reduction on part of the third oxide film of the solder bump bitten in between the solder bump and the second bump electrode.

12. The semiconductor device manufacturing method according to claim 11, wherein the inside of the furnace has a carboxylic acid gas concentration equal to the second carboxylic acid gas concentration at an end point of the melting process.

13. The semiconductor device manufacturing method according to claim 11, wherein the inside of the furnace has a carboxylic acid gas concentration less than the second carboxylic acid gas concentration at an end point of the melting process.

14. The semiconductor device manufacturing method according to claim 11, wherein a pressure of the inside of the furnace is kept at a predetermined pressure lower than atmospheric pressure during a period from the reduction process to the melting process.

15. The semiconductor device manufacturing method according to claim 14, wherein the pressure falls within a range of $1.3 \times 10^4$ Pa or more and $8 \times 10^4$ Pa or less.

16. The semiconductor device manufacturing method according to claim 11, wherein the first carboxylic acid gas concentration is 0.6 vol % or more and 9.2 vol % or less.

17. The semiconductor device manufacturing method according to claim 16, wherein the first carboxylic acid gas concentration is 2.8 vol % to 9.2 vol %, and the second carboxylic acid gas concentration is 0.6 vol % to 2.8 vol %.

18. The semiconductor device manufacturing method according to claim 11, wherein each of the first bump electrode and the second bump electrode is made of a single metal selected from the group consisting of Ni, Cu, Au and Pd, or a composite film formed by stacking two or more metals selected from the group consisting of Ni, Cu, Au and Pd, and the solder bump is made of Sn or an alloy containing Sn.

19. The semiconductor device manufacturing method according to claim 11, wherein the carboxylic acid gas contains a carboxylic acid that is an aliphatic monovalent or divalent lower carboxylic acid.

20. The semiconductor device manufacturing method according to claim 19, wherein the lower carboxylic acid contains at least one selected from the group consisting of formic acid, acetic acid, acrylic acid, propionic acid, oxalic acid, succinic acid, and malonic acid.

* * * * *